United States Patent [19]
Robertson

[11] 3,959,040
[45] May 25, 1976

[54] COMPOUND DIFFUSED REGIONS FOR EMITTER-COUPLED LOGIC CIRCUITS

[75] Inventor: Phillip W. Robertson, Scottsdale, Ariz.

[73] Assignee: Motorola, Inc., Chicago, Ill.

[22] Filed: Sept. 1, 1971

[21] Appl. No.: 176,875

[52] U.S. Cl.................. 148/186; 148/187; 148/188; 148/175; 357/51
[51] Int. Cl.².......................... H01L 7/34
[58] Field of Search............ 148/186, 188, 175, 187

[56] References Cited
UNITED STATES PATENTS

| | | | |
|---|---|---|---|
| 3,354,005 | 11/1967 | Lepiane et al. | 148/186 |
| 3,445,302 | 5/1969 | Lepiane | 148/186 |
| 3,596,149 | 7/1971 | Makimoto | 148/187 X |
| 3,615,932 | 10/1971 | Makimoto et al. | 148/175 |
| 3,676,231 | 7/1972 | Medvecky et al. | 148/188 |
| 3,770,519 | 11/1973 | Wiedmann | 148/175 |

*Primary Examiner*—G. Ozaki
*Attorney, Agent, or Firm*—Harry M. Weiss; Kenneth R. Stevens; Ellen P. Trevors

[57] ABSTRACT

There is provided a method and apparatus for use in fabrication of emitter-coupled logic circuits in integrated circuit form in which the base regions for transistor-transistor logic transistors and tub regions for emitter resistors for use in these circuits are fabricated utilizing a compound diffusion process. The use of the compound diffusion process both reduces spiking problems prevalent with emitter resistors while at the same time enabling the appropriate doping concentrations in the bases of both the ECL transistors and the TTL transistors to be established by opening up these regions during specified portions of the fabrication process.

9 Claims, 4 Drawing Figures

COMPOUND DIFFUSED REGIONS FOR EMITTER-COUPLED LOGIC CIRCUITS

BACKGROUND OF THE INVENTION

This invention relates to the fabrication of emitter-coupled logic circuits which are compatible with transistor-transistor logic circuits and more particularly to a compound diffusion process for fabricating both transistor-transistor logic transistors and emitter resistors used with the emitter coupled logic circuit, which compound diffusion eliminates spiking problems associated with emitter resistors.

One of the most important parameters of computer systems is the speed at which the computer can operate.

In view of the growth of sophistication in the computer industry, it has been found that emitter coupled logic (ECL) circuits provide computers with as must as three times the speed of conventional circuits.

It will be appreciated that ECL circuit modules have application where computer speed is of the essence. This occurs in real time tracking and data acquisition applications as well as in the look ahead circuits utilized to enable the computer to quickly check on its operation at various intervals in a computer program. In general, ECL circuits may be utilized to improve the available capacity of any computer.

The speed of a computer is usually indicated by propagation delay such that computers utilizing emitter coupled logic circuits operate in the 150 to 300 megahertz range as compared to saturated logic circuits involving transistor-transistor logic (TTL) which operate in the 50 megahertz range. The increased speed which is available with emitter coupled logic circuits is due to the fact that the transistors utilized do not saturate in either of their two logic states. These transistors are therefore never turned off. In ECL circuits switching is accomplished between one active current level and another active current level. Contrasted with this are the TTL transistors. The reason for the slower speed of TTL circuits lies in part in the fact that the TTL transistors go from one logic state to another by turning OFF and ON, which takes time.

Another reason for the speed of the emitter coupled logic circuits is the physical size of the circuit itself. It will be appreciated that size addes parasitic capacitance which in general slows the speed at which the logic can operate. Thus computers using circuits of smaller size have a decided speed advantage. A subsidiary yet important consideration is that the cost of the chip is proportional to its size. Emitter-coupled logic circuits, because of their speed, must be made using smaller components and therefore can be fabricated with more chips to the wafer. This not only reduces the parasitic capacitance problem but also achieves a much lower chip cost. Further size is important since the length of the circuits in the computer is an absolute limit on the speed of the computers. Speed is limited by the absolute length of the circuit because of the propagation time of an electrical signal through the circuit from an input to an output. Since modern computers are now approaching the absolute theoretical limit to speed, it is important that the active elements in the computer be reduced in size as much as possible. One further consideration of the size reduction is power consumption. In general, emitter-coupled logic circuits draw more power than their associated transistor-transistor logic circuits. However, by changing the resistor configurations in an ECL circuit, power consumption for these circuits is brought into line with that dissipated by equivalent transistor-transistor logic circuits.

Reduction in size of these ECL circuits requires different geometries and designs. Since one of the major factors in the size of an ECL circuit is the size of the resistors utilized, the making of smaller resistors having the requisite resistance values is significant in the reduction of the size of ECL circuits.

A further consideration which indicates the use of ECL circuits is in part the logic system itself which utilizes simpler logic configurations than is possible with transistor-transistor logic circuits. This makes possible the reduction of the number of transistors necessary for a given logic function. However, since the majority of computers already constructed utilize transistor-transistor logic, a transistor-transistor logic compatibility must be built in both at the input to the ECL circuits and at the output of the ECL circuits so as to make the ECL circuits compatible with the TTL circuits. This is necessary because the ECL logic swings utilize negative voltages while the TTL circuits utilize positive voltage swings. Further the magnitude of the logic swings is different in each case. Those circuits which provide for this compatibility are called "translators" and are built into the ECL chip. The building of TTL components into an ECL chip is not a simple matter and usually requires a large number of extra processing steps.

This invention is therefore directed to a method for fabricating an integrated circuit chip having both ECL and TTL circuits combined with resistors whose circuit areas can be minimized.

In the reduction of size of an ECL circuit chip, it will be appreciated that the low valued resistors utilized as input resistors for ECL transistors range from 50 to 250 ohms. In order to provide these values by conventional diffused resistor techniques, the resistors take up approximately 45 percent of the chip area. It has recently been suggested that emitter resistors be utilized in place of large area resistors to provide the needed resistance values. If emitter resistors are utilized, only 25 percent of the chip area need be utilized for the resistors.

An emitter resistor is one which is formed by diffusing an emitter tub region into a base tub region which base tub region may also be diffused into an epitaxial layer. The resistance is developed solely across the emitter tub region utilizing the base tub region for isolation. The base tub permits the use of 15 ohm/sq. material for the resistors so that the resistor area can be made small. Thus the base isolation tub can be small and no isolating ring is needed. The emitter resistor area can be made small because 15 ohm/sq. material can carry more current per unit area than 100 ohm/sq. material. This permits narrow resistor tubs and increased packing density.

There are, however, serious problems involved in the utilization of emitter resistors in emitter-coupled logic circuits. The primary problem with emitter resistors is referred to herein as "spiking". Spiking refers to a current leakage problem which is thought to be due to lattice damage or imperfections in the base region of the emitter resistor. It is thought that this damage occurs due to high impurity concentrations from the diffused emitter region which extends into the base tub region. The spiking problem is so severe that ECL circuits utilizing emitter resistors have yields of only 14 to 16 percent. This is contrasted with yields of 40 percent when utilizing the subject compound diffusion technique. The current leakage associated with convention emitter resistors is of such a nature that current leakage causes a latch problem in the circuit. This latch problem results in the pulling down of the value of these input resistors from a preset value to a much lower value which throws a given circuit out of its particular logic state; that is the state which it should be in, absent the current leakage problem.

The solution to this spiking problem is the provision of a compound tub diffusion, sometimes called a base diffusion, which all but completely eliminates the spiking problem. The reason that the compound diffusion eliminates the spiking problems is not yet known. It is thought, however, that due to the compound diffusion both a higher impurity concentration is available at the base emitter junction for the emitter resistor and a more uniform surface for the base region is provided. The elimination of spiking may also be due to not only the physical structure which results after the compound diffusion, but also the manner in which the diffusions are made. While it cannot be said that any one step is responsible for the elimination of spiking, the compound diffusions are characterized by a predeposition of a dopant which dopant is in saturated solution at the surface of the substrate to be doped.

The term "compound diffusion" refers to a double diffusion in which the region over the base tub is opened up for two different diffusion cycles in which material of a first impurity concentration is first diffused followed by a diffusion of a material of a second impurity concentration. The resulting impurity concentration in the base isolation region results in a sheet resistivity of 60 ohms per square which sheet resistivity is exactly that which is necessary for the base region of the transistor-transistor logic transistors utilized as the level translators for the ECL circuit. The compound diffusion is accomplished from two separate diffusions which result in surface sheet resistivities of 100 ohms per square and 300 ohms per square when done in two different substrate regions. Because of the difficulty in matching doping profiles and predicting the outcome of compound diffusions, the 60-ohm per square sheet resistivity is not predictable from doing the above two diffusions in the same region of the substrate.

Unexpectedly these two diffusions when done sequentially at the same location result not only in a suitable resistor base region, but also in a region suitable as a base region for TTL transistors. Further, one of these diffusions results in a base region uniquely suited to ECL transistors.

To elaborate, it is a requirement that the TTL transistors have low betas which center around betas of 30. The reason for these low betas is that with saturated logic circuits (TTL) the beta of the transistors must be low in order to reduce device response time. On the other hand, with ECL circuits, the betas must be relatively high and on the order of 150. The ECL circuits require high gain transistors to keep the base current of the transistors as low as possible to conserve on power. The ECL transistors of the subject circuit are typically made by a single diffusion which results in a region having a sheet resistivity of 300 ohms/sq. The TTL transistors are however in need of 60-ohm per square resistivity regions. In the subject process both the emitter resistors and the TTL transistors are made by the compound diffusion process which if done separately in different locations yield regions having resistivities of 100 ohms per square and 300 ohms per square.

As a by-product of the compound diffusion process and because material having a sheet resistivity of 100 ohms per square is made, there is available the 100-ohm per square resistivity for conventional resistors whose values do not need to be as low as 50 to 250 ohms. It will be appreciated that higher valued resistors can be diffused into the chip substrate without too much of a sacrifice in area since their areas are small.

The use of the compound diffusion technique is not obvious over prior art techniques with respect to ECL circuits for at least six reasons. The first of these reasons is that it is not obvious that appropriate base concentrations for TTL devices can be obtained by compound diffusion. The reason that it is not obvious is because compound diffusions rarely have a direct additive effect. This means that it is relatively difficult to predict a final base concentration given two different diffusions. It will be further appreciated that junction profiles and the resulting resistivities cannot easily be calculated theoretically because of the combined impurity profile and the intermediate oxidation steps. The oxide layers resulting from these oxidations in part provide a carrier for the dopants which further complicates prediction of combined impurity concentrations. Secondly, even if this were obvious, it would certainly not be obvious that one could obtain appropriate base concentrations for TTL circuits utilizing one doping concentration which is uniquely appropriate for ECL transistors. Thirdly, it is not obvious that compound diffusion will yield emitter resistors having controllable resistance values, so little is there known about the compound diffusion process. Fourthly, even if it were obvious that the value of emitter resistors could be controlled by compound diffusions, it is not obvious that spiking can be eliminated by any type of compound diffusion process. Fifthly, that one can obtain the elimination of spiking by making materials having TTL and ECL compatible base concentrations is not obvious. Sixthly and finally, by utilizing TTL and ECL compatible base concentrations is not obvious that a total integrated circuit package can be formed with a minimum of processing steps due to the compatibility of the compound diffusion process with the single diffusion processes now utilized in making TTL and ECL devices in discrete areas of the chip. It is the combination of the above effects which enable the same type base region to be formed for TTL transistors and emitter resistors. It is also the above combination which permits the formation of the entire ECL circuit (including translation devices) in two diffusion steps with one diffusion being appropriate for ECL components while the second diffusion enables the formation of the TTL elements, the emitter resistors and standard diffused resistive elements. It should be noted that it is the discovery that spiking can be eliminated in emitter resistors that makes possible the reduction of chip area by as much as 20%.

SUMMARY OF THE INVENTION

It is therefore an object of this invention to provide an improved method for making emitter-coupled logic circuits in integrated circuit form.

It is another object of this invention to provide a method for fabricating emiter resistors utilizing a compound diffusion process so as to eliminate spiking and other current leakage problems associated with emitter resistors.

It is a further object of this invention to provide a method for fabricating transistor-transistor logic compatible emitter coupled logic circuits having reduced chip area.

It is a still further object of this invention to provide a method for fabricating emitter coupled logic circuits in integrated circuit form utilizing compound diffusions for the bases of transistor-transistor logic transistors and base tubs for emitter resistors and by utilizing one of the diffusions in the compound diffusion process for the fabrication of the bases of the emitter coupled logic transistors.

It is still another object of this invention to provide articles made by the above methods.

Other objects and features of this invention will become more fully apparent upon reading the following description taken in connection with the accompanying drawings.

BRIEF DESCRIPTION OF THE INVENTION

There is provided a method and apparatus for use in fabrication of emitter-coupled logic circuits in integrated circuit form in which the base regions for transistor-transistor logic transistors and tub regions for emtter resistors for use in these circuits are fabricated utilizing a compound diffusion process. The use of the compound diffusion process both reduces spiking problems prevelant with emitter resistors while at the same time enabling the appropriate doping concentrations in the bases of both the ECL transistors and the TTL transistors to be established by opening up these regions during specified portions of the fabrication process.

DETAILED DESCRIPTION OF THE INVENTION

Figure 2:
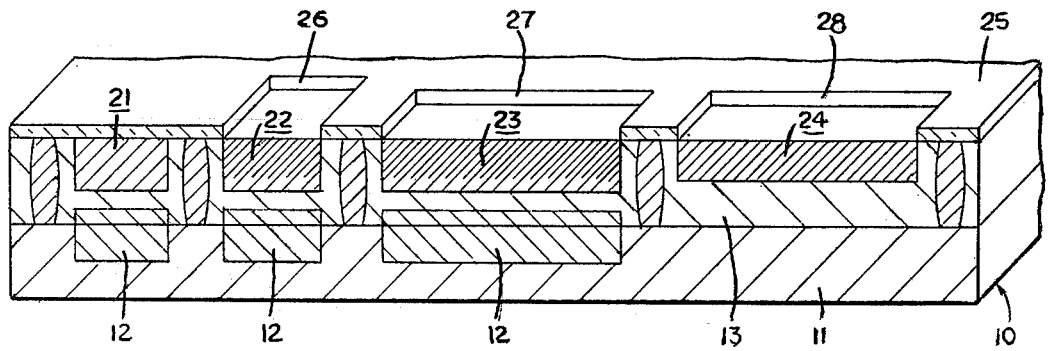
FIG. 2 shows the opening of a mask over the TTL transistor and the emitter resistor regions so as to permit a further diffusion resulting in a compound diffused region for each of these two elements. At this point a region is also opened up to permit the formation of a standard diffused resistor.
Figure 3:
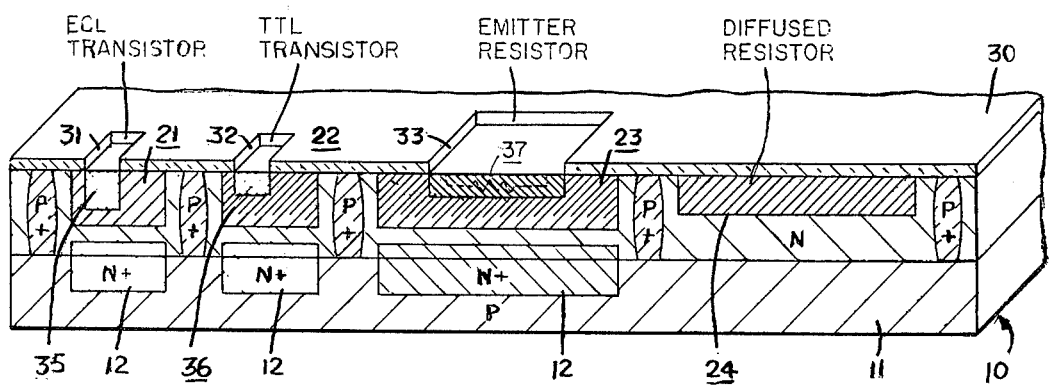
FIG. 3 shows the opening up of a mask so as to permit the formation of the emitters for the ECL transistor and the TTL transistor and to permit the formation of an emitter-like region of the emitter resistor.

As mentioned hereinbefore, the production of emitter resistors for use in emitter-coupled logic circuits permits the reduction of the area of the circuit thereby decreasing the parasitic capacitance associated with the circuit so as to increase its speed. However spiking heretofore has limited the use of emitter resistors for this purpose. The spiking more particularly refers to physical spikes of emitter tub type material which spike through the base isolation tub in an epitaxial layer on top of a substrate causing a direct short of the emitter resistor to the epitaxial layer. This structure is shown in FIGS. 1 – 3 which are used hereinafter to illustrate the subject process.

Figure 1:
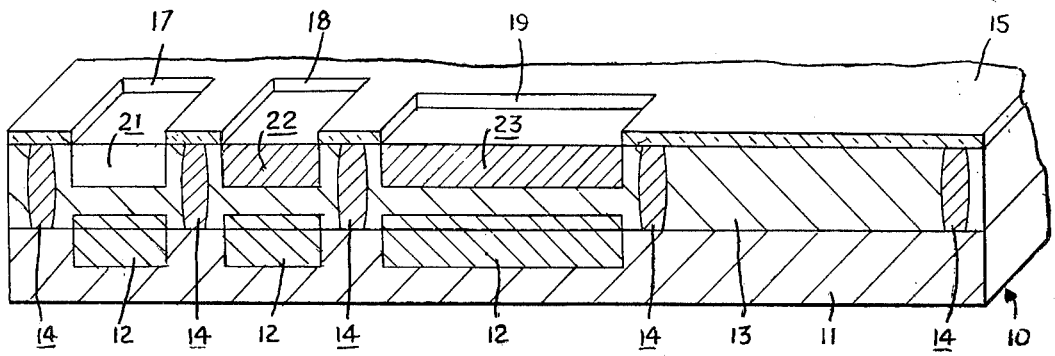
FIG. 1 is a cross-sectional diagram of an intermediate structure in the formation of an emitter-coupled logic chip showing the opening of a mask over top regions later to become an ECL transistor, a TTL transistor and an emitter resistor in the emitter-coupled logic circuit.

What is shown in FIG. 1 is an intermediate structure in the fabrication of an emitter-coupled logic circuit. This structure is comprised briefly of a substrate 11 into which are diffused buried layer regions 12. On top of the substrate 11 is epitaxially formed an epitaxial layer 13 of a conductivity type opposite to that of the substrate and similar to that of the buried layers. Down through the epitaxial layer are diffused isolation regions 14 which extend from the top surface of the chip 10 so as to surround the various active and passive elements which are to be formed in the chip. The production of the structure thus described in one embodiment is as follows.

The entire structure is referred to as a package or wafer 10. The substrate 11 of this wafer is a P type substrate having a 6- to 8-ohm centimeter resistivity with a <100> crystallographic orientation. The top surface of this substrate is oxidized and windows are cut in the oxidation for the buried layer diffusions. In one embodiment the buried layers are formed by diffusion of arsenic to a 3 to 5 micron depth with a 6 to 18 ohms per square sheet resistivity. After the diffusion the oxide is stripped from the surface of the substrate with a hydrogen fluoride acid etch. A hydrogen chloride acid etching step follows as a cleaning step so as to remove approximately ½ micron of material from the surface of the substrate. This latter cleaning step may be done in an epitaxial furnace such that the following epitaxial growth step may be accomplished without contamination of the surface of the substrate. There is then grown a 2.7 to 3.3 micron epitaxial layer as shown by the reference character 13 by use of silane and hydrogen. With the growth of the epitaxial layer it will be appreciated that the buried layer regions 12 now extend up into the epitaxial layer 13 a predetermined distance via n outdiffusion process. After the growth of the epitaxial layer, an oxidation layer is grown for an initial masking operation. The first masking operation is for the purpose of locating the aforementioned isolation diffusions. The oxidation layer (not shown) is patterned and etched in a standard photolithographic process and standard isolation diffusions 14 follow. An oxide layer 15 is then regrown for what is referred to as the base masking. The term "base" is used herein in its conventional sense to refer to base regions for transistors. In addition, it also refers to the base tub or isolation region for an emitter resistor. Also, when the term "base diffusion" is used it refers not only to the base regions for various transistors and to the formation of the isolation region for emitter resistors, but also to the formation of the standard diffused resistors. Up to this point, that is the point of the re-growth of the oxide for the first base masking, the steps are in general conventional.

As can be seen from FIG. 1, the mask 15 is opened over the regions 17, 18 and 19. The region 17 is that region at which the ECL transistor is to be formed, the region 18 being the region at which the TTL transistor is to be formed and the region 19 being the region at which the emitter resistor is to be formed. It will be appreciated at this point that the region over the standard diffused resistor is not open. After the regions 17, 18 and 19 and have been opened up, a 300-ohm per square base diffusion is diffused into the epitaxial layer 13 so as to form the regions 21, 22 and 23. The region 21 is to become the base region for the ECL transistor. The region 22 is to become the base region for the emitter resistor. The density of the shading lines used to identify the regions 21, 22 and 23 represents the impurity concentration in these regions.

In order to achieve a precise doping concentration at the surface of these regions, it is important that a saturated solution of the impurity utilized be available at the surface of each of the regions 21, 22 and 23 before the driving-in step is commenced. The reason for requiring a saturated solution at the surface is the control over the driving-in process and the doping profile. This control cannot be easily achieved without a known amount of impurity-bearing material at the surface. In one particular configuration, this predeposition is accomplished by using a saturated solution of boric anhydride in a solvent. Once the saturated solution has been obtained, more solvent is added to the solution so that 10 percent of the total volume of solution thus formed is the saturated solution of boric anydride. The starting materials for this process are $B_2O_3$ + 2-methyloxyethanol. The 10 percent solution is dispensed over the surface of the wafer 10 and the excess solvent is blown off such that the resulting compound on the surface is a $B_2O_3$ source.

The wafer is then placed in a furnace having a nitrogen atmosphere with the furnace being maintained at 980°C± 2°C. such that the chip is subjected to this temperature for 12 minutes. This results in a predictable boron gaussian distribution at the surface of the epitaxial layer and completes the predeposition of boron at the surface of the epitaxial layer. In this case boron is called the source. The resulting sheet resistivity of the source is on the order of 61 to 65 ohms per square.

The excess boron is then removed by a mild hydrogen fluoride etching step in which ten parts of water are mixed with one part of hydrogen fluoride. The solution thus formed is brought into contact with the top surface of the structure thus formed for 60 seconds. Thereafter the structure is rinsed and dried and then subjected to a ten-minute steam driving-in step. The steam is maintained at a temperature of from 1060°C. After subjecting the wafer to ten minutes worth of steam, a 5-minute drying step in oxygen is included also at 1060°C. The resulting sheet resistivity of the regions 21, 22 and 23 at this point is between 226 and 236 ohms per square. While the resistivity of the region 21 has not at this point reached the 300-ohm per square requirement, this requirement will be met by further processing.

Because of the use of steam in the driving-in step, an oxide layer commonly referred to as the re-grown oxide is formed as shown by the layer 25 of FIG. 2. As shown in FIG. 2, this re-grown oxide region 25 is used as the second base mask region and is opened up at the regions 26, 27 and 28 which regions correspond respectively to the TTL transistor, the emitter resistor and the standard diffused resistor. At this point it will be appreciated that the region 21 is masked from further diffusion. After the opening of the masked layer 25, a predeposition of boron is performed in exactly the same manner as that described above except that the boric anhydride at the surface of the epitaxial region 13 is heated at 980°C in a nitrogen atmosphere for 48 minutes. The sheet resistivity at the surface of the exposed portions of the epitaxial layer due to the second deposition (as measured at the surface of the standard diffused resistor region designated by the region 24) is between 33 and 37 ohms per square at the surface. Thereafter a 10 to 1 $H_2O$-HF etching solution is utilized as before to remove excess boron. Following this cleaning step the wafer is again subjected to a steam driving-in step again at 1060°C for 12 minutes.

The first result of the second driving-in step is to deepen the base of the ECL transistor as shown by the base region 21 of FIG. 2. Additionally, the sheet resistivity of the region 21 is boosted by this further driving-in step to between 290 and 310 ohms per square. At this point the original 0.6-micron depth of the diffusion is increased to 0.81 microns.

The second effect of the driving-in step is the formation of the standard diffused resistor region 24 which in general has a sheet resistivity of between 95 and 102 ohms per square and has a diffusion depth of between 0.6 and 0.7 microns. This diffused resistor is capable of providing high resistance values while at the same time not taking up too much chip area.

The third result of the second diffusion is the formation of the double-diffused base regions 22 and 23 having a surface sheet resistivity of 60 ohms per square with each of these regions having a 0.81-micron depth to the deepest point below the surface of the epitaxial region 13. The decrease in the sheet resistivity of these regions is indicated by the more heavy shading in these regions indicated by the increased density in shading lines. It will be appreciated that this 60 ohms per square resistivity is exactly that necessary for the base regions of the TTL transistors. Likewise this decrease in resistivity reduces spiking in the emitter resistor.

Because it is nearly impossible to predict the junction profile of compound diffusions and because it is even more difficult to utilize a diffusion which is exactly right for ECL transistors, the combined base surface sheet resistivity at the exact appropriate level is surprising.

An unexpected result of this double diffusion process and one which permits the use of emitter resistors in smaller emitter coupled logic circuits is the marked decrease and in fact elimination of spiking in the emitter resistor. The standard test for spiking is as follows.

A voltage is placed on the input gate of an ECL circuit. The $V_{cc}$ and $V_{ee}$ voltages are applied and the input current is measured. If spiking occurs the input current is excessive because a portion of the input emitter resistor is shorted through its base tub to $V_{cc}$, thereby providing a low resistance path to $V_{cc}$.

Figure 4:
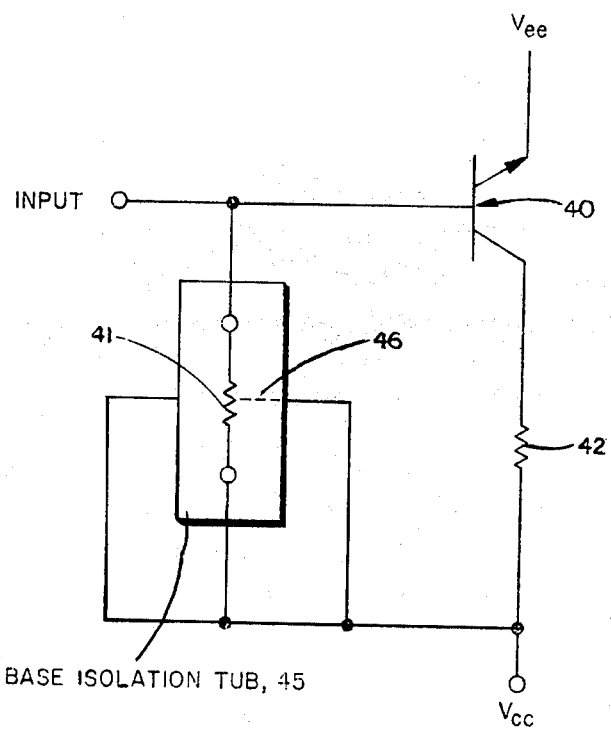
FIG. 4 shows a schematic diagram of an ECL circuit showing an input emitter resistor and indicating the spiking leakage condition.

This spiking phenomena is illustrated in FIG. 4. Here a typical NPN ECL transistor is shown at 40 with an input signal applied to its base. Tied to its base is an input resistor 41 which goes from this input to $V_{cc}$ as shown. The emitter of the transistor 40 is coupled to $V_{ee}$, typically −5.2 volts, while the collector is typically coupled through a resistor 42 to $V_{cc}$ = 0 volts or ground.

The emitter resistor 41 is however diffused into a base tub 45 which has an outer junction at ground potential. Therefore any spiking shown diagrammatically by the dotted line 46 provides a low resistivity path between the input and ground. It has been found while in the past only 15 percent of ECL circuit chips passed the above test, now on the order of 40 percent pass this test which is a considerable improvement.

Referring now to FIG. 3, it will be appreciated that because of the last mentioned driving-in step a further re-grown oxide layer 30 is formed. This oxide layer is photolithographically patterned and etched so as to provide the emitter openings 31, 32 and 33 over portions of the regions 21, 22 and 23. At this point the diffused resistor comprising the region 24 is left masked. Standard emitter diffusions are then provided through these openings such that the emitters 35, 36 and 37 are formed. As mentioned hereinbefore, the beta of the ECL transistor must be on the order of 150. This dictates a junction depth for the region 35 on the order of 0.6 microns which results in a base width for the ECL transistor of approximately 0.1 to 0.2 microns. The emitter junction depth in the TTL transistor however is held to 0.45 microns such that the resulting base width produces a low beta, i.e., a beta of 30 for this transistor. These junction depths are automatically provided for by the doping concentrations in the base regions for these transistors, such that only one emitter diffusion is necessary. The emitter resistor is also provided with this "emitter" diffusion although this diffusion does not actually function in the nature of an emitter but rather serves as a resistor.

The emitters for the emitter resistors are made as follows so as to achieve the required 15 ohm/sq. sheet resistivity at the surface which allows the formation of emitter resistors having values of 50 ohms. It will be appreciated that the emitter of the emitter resistor is made simultaneously with the emitters of all the rest of the transistors. Thus the value of the emitter resistor is determined only by the size of the emitter diffusion. Because emitter resistivities are made a uniform 15 ohms/sq. so as to enable a single emitter diffusion for all emitters, spiking is more prevalent. This is because emitter resistors having 15 ohm/sq. emitters have conventional base tubs which are not uniform at the emitter base junction and which do not have low resistivities.

In one embodiment the emitter diffusion is accomplished by the introduction of phosphoroxyl-chloride (POClhd 3) in gaseous form into an open tube diffusion furnace maintained at 965°C. Prior to the introduction of this doping, the wafers are subjected to an oxidizing step in which they are heated to 965°C in an oxygen rich ambient for 15 minutes. This results in the growth of an oxide layer thereon. The oxide acts as a shield to reduce contamination and for providing a uniform diffusion therethrough to further eliminate spiking. The POCl$_3$ is then introduced for 25 minutes until the sheet resistivity at the surface of the diffused regions reaches a 15 ohm/sq. value. Thereafter the wafers are removed from the diffusion furnace and placed in a 900°C steam ambient for 30 minutes followed by heating the wafers in dry oxygen for an additional 30 minutes. The final doping concentration in these emitters is determined by time, source temperature, source carrier gas flow rate, and the initial carrier-source composition. Nitrogen is the usual carrier gas for phosphoroxyl-chloride. It will be appreciated that this diffusion technique is less accurately controlled than the technique utilizing saturated doped surfaces.

However it is thought that the elimination of spiking is due not to the emitter diffusion process which is standard but rather to the saturated dopant diffusion process for the compound base region which seems to control even the most poorly controlled emitter diffusions so as to eliminate spiking.

The resulting structure is then provided with standard patterned metallization so as to interconnect the various elements of the emitter coupled logic circuit.

It will be appreciated that other compound diffusion techniques than that illustrated will result in both the elimination of spiking and the formation of acceptable base regions for ECL and TTL transistors in an ECL integrated circuit as long as a compound diffusion is utilized. This is to say that if transistors having different betas than those described are required, different sheet resistivities will nonetheless result in reduced spiking while at the same time producing the desired transistor base regions as long as the impurity concentration in the base isolation region is increased to give a sufficiently low sheet resistivity. In addition the compound diffusion can be used by itself to provide either emitter resistor bases or TTL transistor base regions.

What has been accomplished is the formation of all the elements necessary for an emitter coupled logic chip including TTL translation devices therein. The most important part of the ECL monolithic integrated circuit formation is the size reduction which is accomplished by solving the spiking problem of the emitter resistors. In addition, concentrations have simultaneously been provided which concentrations are appropriate for the formation of ECL transistors, TTL transistors, emitter resistor bases and diffused resistors all from a double diffusion process in which one of the diffusions results in a base region which is uniquely suited for the high beta ECL transistors while at the same time providing equally appropriate base regions for the TTL transistor and the tub region for emitter resistors. As a further by-product of this compound diffusion process, standard diffused resistors having high values may be simultaneously formed.

What is claimed is:

1. In a method for forming a logic circuit in monolithic integrated circuit form, said logic circuit having an emitter-coupled logic transistor and an emitter resistor, the improvement comprising the steps of:

providing a semiconductor region of a first conductivity-type having a layer of a second conductivity-type contiguous therewith, said layer having a surface;

masking the surface of the layer with a first mask; opening up said first mask at locations at which the base region for the emitter-coupled logic transistor and the tub region for said emitter resistor are to be formed;

diffusing into said layer at said locations a dopant to a concentration suitable for forming said base region and said tub region;

remasking said surface of said layer with a second mask; opening up said second mask over said emitter resistor tub region; and diffusing into said tub region a dopant to a concentration which brings the doping concentration in said tub region to a level sufficient to eliminate spiking in a finished emitter resistor.

2. The method of claim 1 further including the steps of:

again remasking said surface of said layer with a third mask;

opening up said third mask over locations at which emitters for said transistor and for said resistor are to be located; and diffusing a dopant through said openings for forming said emitters, whereby all emitter regions are formed simultaneously with the relative diffusion depths automatically controlled by the doping concentration in said base and tub regions.

3. The method of claim 1 wherein said logic circuit further includes a transistor-transistor logic transistor, said first mask is also opened up at a location for the base region for said transistor-transistor logic transistor, said base region is formed by diffusion while diffusing to form the base region for said emitter-coupled logic transistor and the tub region for said emitter resistor, said second mask is also opened up over the transistor-transistor logic transistor base region, and diffusion into said base region is carried out to a concentration which brings the doping concentration in said base region to a level commensurate with the low betas necessary for said transistor-transistor logic transistor.

4. The method of claim 3 further including the steps of:
   again remasking said surface of said layer with a third mask;
   opening up said third mask over locations at which emitters for said transistors and for said resistor are to be located; and
   diffusing a dopant through said openings for forming said emitters, whereby all emitter regions are formed simultaneously with the relative diffusion depths automatically controlled by the doping concentrations in said base and tub regions.

5. The method of claim 4 wherein said logic circuit further includes a diffused resistor, said second mask is also opened up over the location at which said diffused resistor is to be formed, and diffusion into said location is carried out to a concentration sufficient to provide a high resistance value for said diffused resistor.

6. The method as recited in claim 5 wherein the final sheet resistivity of the base regions of said emitter-coupled logic transistor measured at the surfaces of said base regions is between 290 and 310 ohms per square.

7. The method as recited in claim 5 wherein the diffusion steps comprise:
   forming on said layer a solution of doping material;
   removing excess solvent from said solution;
   heating said doping material in an inert atmosphere such that a predictable dopant distribution occurs at the surface of said layer, whereby a sheet resistivity lower than that required occurs;
   removing the excess doping material from said epitaxial layer; and
   subjecting said layer to hot steam treatments and oxygen drying steps so as to raise the sheet resistivity of the diffused region.

8. The method as recited in claim 7 wherein the steam treatments are carried out to obtain a surface sheet resistivity for the double diffused regions of approximately 60 ohms per square.

9. The method as recited in claim 8 wherein the steam treatments are carried out to obtain a sheet resistivity for said diffused resistors of between 95 and 102 ohms per square and for said emitter-coupled logic transistors of between 290 and 310 ohms per square.

* * * * *